(12) United States Patent
Wang

(10) Patent No.: US 10,763,413 B2
(45) Date of Patent: Sep. 1, 2020

(54) LIGHT EMITTING DIODE WITH PADS ON SIDE SURFACE THEREOF, LIGHT EMITTING DEVICE AND DISPLAY DEVICE INCLUDING THE LIGHT EMITTING DIODE

(71) Applicants: BOE TECHNOLOGY GROUP CO., LTD., Beijing (CN); BOE OPTICAL SCIENCE AND TECHNOLOGY CO., LTD., Suzhou, Jiangsu (CN)

(72) Inventor: Tao Wang, Beijing (CN)

(73) Assignees: BOE TECHNOLOGY GROUP CO., LTD., Beijing (CN); BOE OPTICAL SCIENCE AND TECHNOLOGY CO., LTD., Suzhou, Jiangsu (CN)

( * ) Notice: Subject to any disclaimer, the term of this patent is extended or adjusted under 35 U.S.C. 154(b) by 126 days.

(21) Appl. No.: 15/518,877

(22) PCT Filed: Jun. 3, 2016

(86) PCT No.: PCT/CN2016/084712
§ 371 (c)(1),
(2) Date: Apr. 13, 2017

(87) PCT Pub. No.: WO2017/156890
PCT Pub. Date: Sep. 21, 2017

(65) Prior Publication Data
US 2018/0102465 A1    Apr. 12, 2018

(30) Foreign Application Priority Data

Mar. 14, 2016  (CN) ..................... 2016 2 0193964 U

(51) Int. Cl.
*H01L 33/62* (2010.01)
*H01L 33/38* (2010.01)
(Continued)

(52) U.S. Cl.
CPC ............... *H01L 33/62* (2013.01); *G09F 9/33* (2013.01); *H01L 24/29* (2013.01); *H01L 33/00* (2013.01);
(Continued)

(58) Field of Classification Search
CPC ..... H01L 23/488; H01L 23/498; H01L 33/00; H01L 33/62; H01L 2224/48463;
(Continued)

(56) References Cited

U.S. PATENT DOCUMENTS 7,250,633 B2 * 7/2007 Seo .................. H01L 27/15
257/80
8,643,033 B2 * 2/2014 Saito .................. H01L 25/0753
257/88

(Continued)

FOREIGN PATENT DOCUMENTS

| CN | 101359704 A | 2/2009 |
| CN | 101877383 A | 11/2010 |
| KR | 20130077059 A | 7/2013 |

OTHER PUBLICATIONS

Lin, English Machine translation of CN Publication No. CN101359704, Feb. 4, 2009; (Machine Translated Sep. 7, 2018).*

(Continued)

*Primary Examiner* — Mohsen Ahmadi
(74) *Attorney, Agent, or Firm* — Womble Bond Dickinson (US) LLP

(57) ABSTRACT

The present application relates to a light emitting diode, a light emitting device, and a display device. The light emitting device includes a light emitting diode and a substrate; the substrate is coated with a bonding substance; the light emitting diode is provided with a positive electrode pad and a negative electrode pad; the surface of the positive electrode pad and/or the negative electrode pad is provided with (Continued)

a plurality of protrusions which are embedded in the bonding substance; and the positive electrode pads and the negative electrode pads are fixed to the substrate through the bonding substance. The embodiment of the present application provides projections on the pad of the light emitting diode, avoids the need of increasing the area of the pad, increases the contact area between the pad and the solder with the constant pad area, improves the bonding stability between the light emitting diode and the substrate, and reduces the production cost.

7 Claims, 3 Drawing Sheets

(51) Int. Cl.
| | | |
|---|---|---|
| *H01L 33/00* | (2010.01) | |
| *G09F 9/33* | (2006.01) | |
| *H01L 23/00* | (2006.01) | |
| *H01L 33/48* | (2010.01) | |
| *H01L 33/64* | (2010.01) | |
| *H01L 23/488* | (2006.01) | |
| *H01L 23/498* | (2006.01) | |

(52) U.S. Cl.
CPC ............ *H01L 33/38* (2013.01); *H01L 33/486* (2013.01); *H01L 23/488* (2013.01); *H01L 23/498* (2013.01); *H01L 33/642* (2013.01); *H01L 2224/2912* (2013.01); *H01L 2224/29028* (2013.01); *H01L 2224/29101* (2013.01); *H01L 2224/29111* (2013.01); *H01L 2224/29139* (2013.01); *H01L 2224/29147* (2013.01); *H01L 2924/014* (2013.01); *H01L 2924/12041* (2013.01)

(58) Field of Classification Search
CPC ....... H01L 2224/73257; H01L 33/0224; H01L 33/36; H01L 33/382; H01L 33/385; H01L 33/387; G09F 9/33
See application file for complete search history.

(56) References Cited

U.S. PATENT DOCUMENTS

| | | | | |
|---|---|---|---|---|
| 8,698,185 | B2* | 4/2014 | Han | H01L 33/20 |
| | | | | 257/99 |
| 8,985,794 | B1* | 3/2015 | Katona | F21K 9/64 |
| | | | | 362/84 |
| 9,651,839 | B2* | 5/2017 | Hu | H01L 21/77 |
| 2008/0054290 | A1 | 3/2008 | Shieh et al. | |
| 2012/0049157 | A1* | 3/2012 | Nago | H01L 21/02389 |
| | | | | 257/13 |
| 2012/0228776 | A1* | 9/2012 | Ohno | C23C 24/04 |
| | | | | 257/773 |
| 2013/0256734 | A1* | 10/2013 | Yang | H01L 33/642 |
| | | | | 257/99 |
| 2015/0021642 | A1* | 1/2015 | Nakabayashi | H01L 33/62 |
| | | | | 257/98 |
| 2015/0034996 | A1* | 2/2015 | Chao | H01L 33/62 |
| | | | | 257/99 |

OTHER PUBLICATIONS

Hoon, English Machine translation of KR Application No. KR20110145567, Jul. 9, 2013; (Machine Translated Sep. 7, 2018).*
International Search Report and Written Opinion in PCT/CN2016/084712 dated Dec. 19, 2016, with English translation. 15 pages.

* cited by examiner

LIGHT EMITTING DIODE WITH PADS ON SIDE SURFACE THEREOF, LIGHT EMITTING DEVICE AND DISPLAY DEVICE INCLUDING THE LIGHT EMITTING DIODE

CROSS REFERENCE OF RELATED APPLICATION

This application claims the priority of the precedent Chinese patent application No. 201620193964.7, the entire contents of which are incorporated herein by reference.

TECHNICAL FIELD

The present application relates to the field of display technology, and more particularly to a light emitting diode, a light emitting device, and a display device.

BACKGROUND

Light-Emitting Diodes (LED) is a kind of semiconductor diode, which is widely used in fields of LED display, LCD backlight, lighting source and traffic lights, etc.

Surface Mount Technology (SMT) is an assembly technology of replacing traditional electronic components with components having a volume which is a few tenths of the volume of the traditional components, and attaching and welding the surface mount components directly on specified locations of a printed circuit board.

In the prior art, a LED package is connected to the substrate through a bonding pad, and the problem of bonding pad falling off due to the instability of bonding between the LED and the substrate is liable to occur. In the prior art, in order to improve the stability of picking and placing, the bonding pad area for the LED is increased, and the SMT production process is strictly controlled. However, the bonding pad production process is complex, and increasing the area of the pad will increase the production cost of LED, and once the SMT production process goes wrong, it will lead to instability of picking and placing and affect the performance of the LED.

SUMMARY

The present application attempts to solve the technical problem of how to improve the stability of the bonding between the light emitting diode and the substrate and to reduce the manufacturing cost.

To this end, the present application proposes, in one aspect, a light emitting device comprising: a light emitting diode and a substrate; wherein the substrate is coated with a bonding substance; the light emitting diode is provided with a positive electrode pad and a negative electrode pad; The surface of the positive electrode pad and/or the negative electrode pad is provided with a plurality of protrusions embedded in the bonding substance; and the positive electrode pad and the negative electrode pad are fixed to the substrate through the bonding substance.

In some embodiments, the positive electrode pad and/or the negative electrode pad are located on the bottom surface of the light emitting diode.

In some embodiments, the positive electrode pad and/or the negative electrode pad are located on the side surface of the light emitting diode.

In some embodiments, the positive electrode pad and/or the negative electrode pad extends from the side surface of the light emitting diode to the bottom surface of the light emitting diode.

In some embodiments, the substrate is provided with a groove in which the light emitting diode is located.

In some embodiments, the protrusions have a cross-section of rectangular, triangular, or wavy shape.

In some embodiments, the bonding substance is solder.

In some embodiments, each of the protrusions extends in a direction perpendicular to the plane at which the pad is located.

In some embodiments, the protrusions are formed on the surface of the pad using die casting, 3D printing, wiredrawing or spraying.

In some embodiments, the light emitting diode and the substrate coated with the bonding substance are fixedly connected by means of thermal baking after aligning.

In some embodiments, the area of the positive electrode pad is smaller than the area of the negative electrode pad.

According to another aspect of the present application, there is provided a display device comprising the above-described light emitting device.

According to another aspect of the present application, there is proposed a light emitting diode provided with a positive electrode pad and a negative electrode pad; and a plurality of protrusions are provided on the surface of the positive electrode pad and/or the negative electrode pad.

The various embodiments provided by the present application by providing a plurality of protrusions on the bonding pads of the light emitting diodes, avoid the increase of the pad area and increase the contact area between the pads and the solder with the constant pad area, improve the stability of the bonding between the light emitting diode and the substrate, and reduce the manufacturing cost. Meanwhile, the projection provided on the pad on the light-emitting diode facilitates heat dissipation and extends the life of the light-emitting diodes.

BRIEF DESCRIPTION OF FIGURES

The features and advantages of the present application will become more apparent from the following description with reference to the accompanying drawings, which are schematic and not to be construed as limiting the scope of the present application, in which drawings.

DETAILED IMPLEMENTATIONS

Hereinafter, embodiments of the present application will be described in detail with reference to the accompanying drawings.

Figure 1:
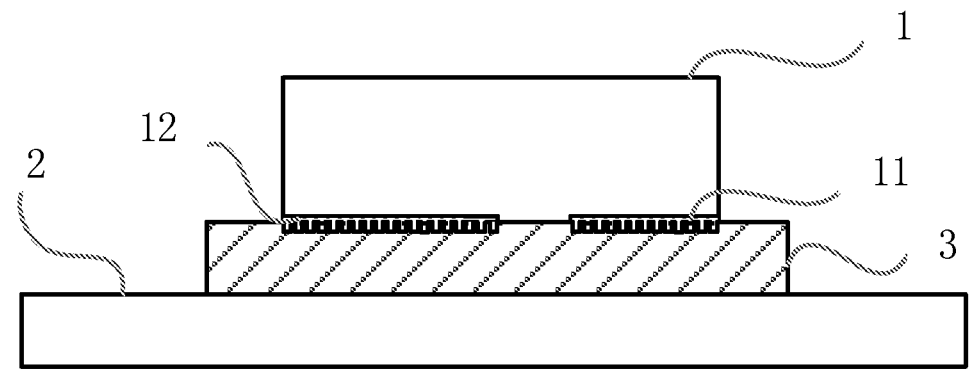
FIG. 1 shows a schematic view of the structure of a light emitting device according to an embodiment of the present application.

FIG. 1 shows a schematic structural view of a light emitting device according to an embodiment of the present application. As shown in FIG. 1, the light emitting device of this embodiment includes a light emitting diode 1 and a substrate 2, wherein the substrate 2 is coated with a bonding substance 3. The light emitting diode 1 is provided with a positive electrode pad 11 and a negative electrode pad 12, and the surfaces of the positive electrode pad 11 and the negative electrode pad 12 are provided with a plurality of protrusions embedded in the bonding substance 3, and the positive electrode pad 11 and the negative electrode pad 12 are fixed to the substrate 2 by bonding substance 3.

In a practical application, the contact area between the pad and the solder can be increased by providing the protrusions only on the surface of the positive electrode pad 11 or only on the surface of the negative electrode pad 12. In order to further increase the contact area between the pad and the solder, the surfaces of both the positive electrode pad 11 and the negative electrode pad 12 are usually provided with protrusions to enhance the bonding stability of the light-emitting diode and the substrate.

The light-emitting device of the present embodiment increases the contact area between the pad and the solder by providing the protrusions on the pad of the light-emitting diode with a constant pad area, and improves the bonding stability of the light-emitting diode and the substrate, does not need relying on a lager area of the pad for improving the bonding stability of the light-emitting diode and the substrate, which reduces the manufacturing cost. At the same time, the projections provided on the pad on the light-emitting diode are more conducive to heat dissipation, extending the life of the light-emitting diodes.

The positive electrode pad 11 and the negative electrode pad 12 shown in FIG. 1 are located on the bottom surface of the light emitting diode 1. The area of the positive electrode pad 11 is smaller than the area of the negative electrode pad 12. It is to be noted that, in practical applications, the positive electrode pad 11 and/or the negative electrode pad 12 may be provided on the side surfaces of the light emitting diode as required.

Figure 2A:
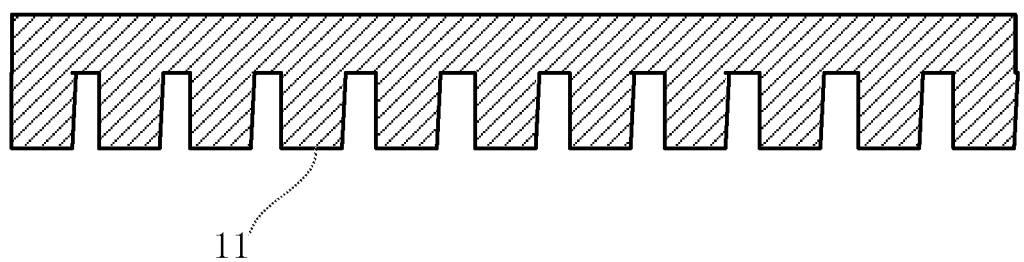
FIGS. 2a, 2b, and 2c show a schematic cross-sectional view of the protrusions of the present application.
Figure 2B:
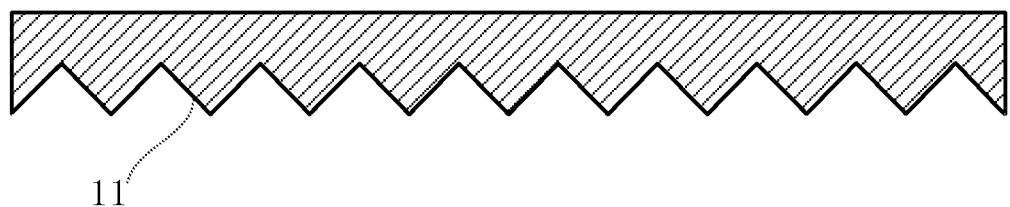
Figure 2C:
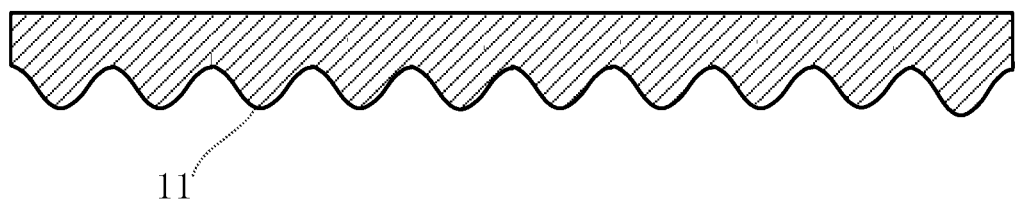

FIG. 2 is a schematic cross-sectional view of the protrusion. As shown in FIG. 2, the cross-section of the protrusion on the surface of the positive electrode pad has a rectangular (FIG. 2a), triangular (FIG. 2b) or wavy (FIG. 2c) shape. Of course it will be understood that the invention is not limited thereto and that the cross-sectional shape may also be other irregular shapes. The protrusions are preferably microbumps having dimensions in the range of a few microns to several tens of microns in directions of width and height. The width direction is a direction parallel to the surface of the pad, and the height direction is a direction perpendicular to the surface of the pad.

Preferably, the bonding substance 3 is solder, which may be tin-lead alloy solder, antimony-contained solder, cadmium-contained solder, silver-contained solder or copper-contained solder. Employing the solder as a bonding substance of the light-emitting diode and the substrate can enhance the bonding stability of the light-emitting diodes and substrates.

In order to further increase the contact area between the pad and the solder, the extension direction of the protrusion is set perpendicular to the plane where the pad is located, to further enhance the bonding stability of the light-emitting diode and the substrate, thereby avoiding the increase in the production cost due to the increase of the pad area.

In practical applications, the protrusions are formed on the surface of the pads by die casting, 3D printing, wire drawing or spraying; the light-emitting diodes and the substrate coated with the bonding substance are fixedly connected by means of thermal baking after aligning. It is not limited by this embodiment.

Figure 3:
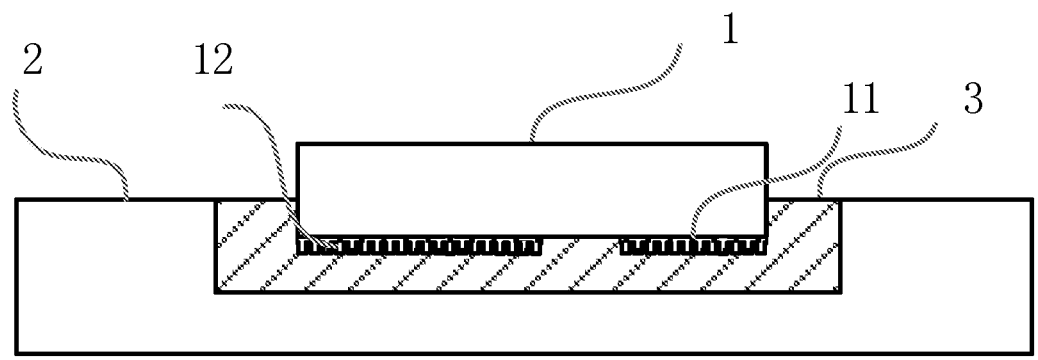
FIG. 3 shows a schematic view of the structure of a light emitting device according to another embodiment of the present application.

FIG. 3 shows a schematic structural view of a light emitting device according to another embodiment of the present application. The embodiment shown in FIG. 3 is substantially the same as the embodiment shown in FIG. 1, with the main difference being that the substrate 2 is provided with a groove in which the light emitting diode 1 is located. Optionally, a portion of the light emitting diode 1 is located in the groove and the other portion thereof protrudes out of the groove.

Figure 4A:
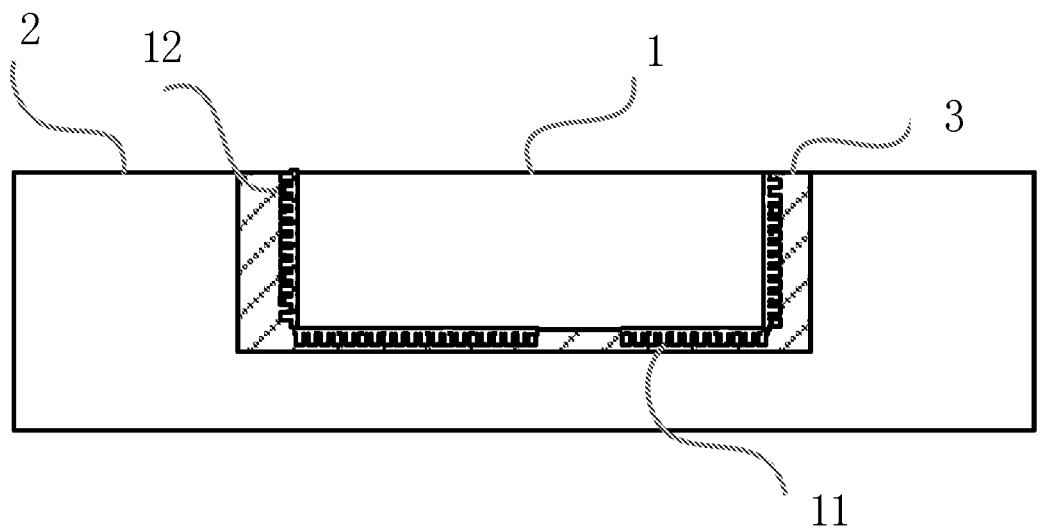
FIGS. 4a, 4b, and 4c show a schematic structural view of a light emitting device according to still another embodiment of the present application.

FIG. 4a shows a schematic structural view of a light emitting device according to still another embodiment of the present application. The embodiment shown in FIG. 4a is substantially the same as the embodiment shown in FIG. 1, with the main difference being that the positive electrode pad 11 and the negative electrode pad 12 of the embodiment shown in FIG. 4a are located on the bottom surface and side surfaces of the light emitting diode 1; and the substrate 2 is provided with a groove in which the light emitting diode 1 is located. Optionally, the light emitting diode is fully embedded in the groove.

Figure 4B:
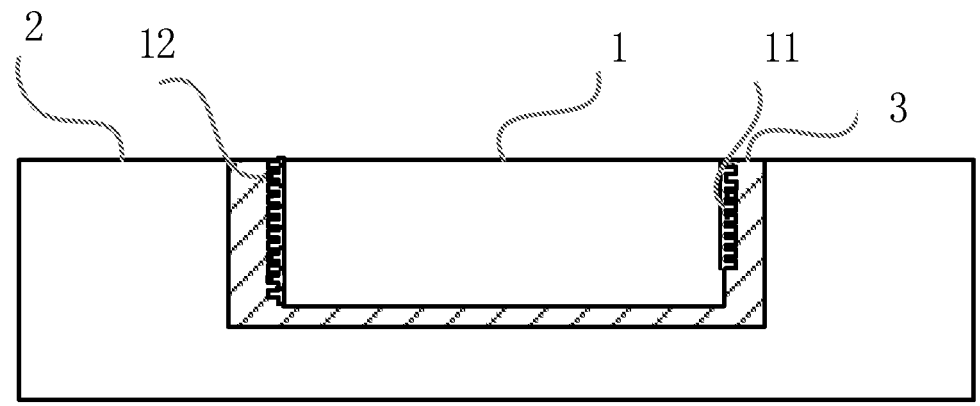

As a variation of this embodiment, the positive electrode pad 11 and the negative electrode pad 12 may be provided only on the side surfaces of the light emitting diode (as shown in FIG. 4b).

Figure 4C:
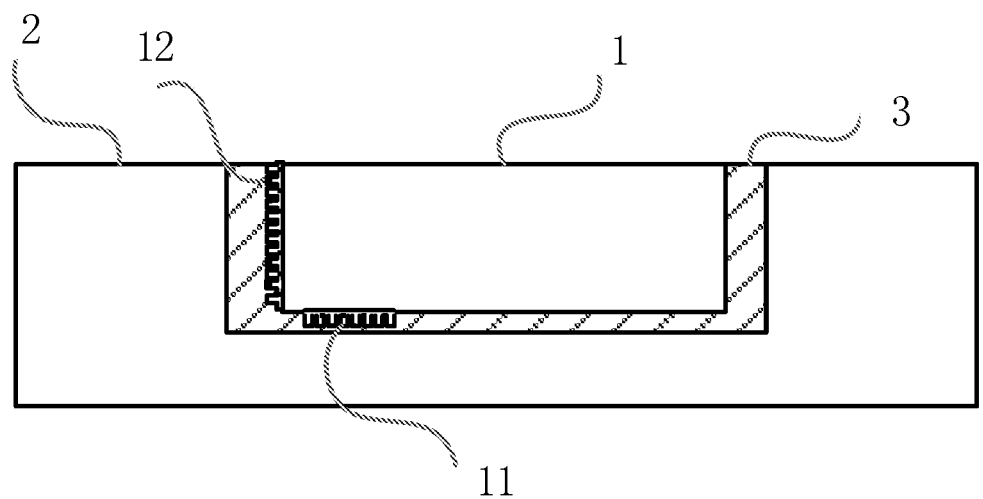

As another variation of this embodiment, the positive electrode pad 11 may be provided on the side surface of the light emitting diode, and the negative electrode pad 12 is provided on the bottom surface of the light emitting diode (as shown in FIG. 4c).

The present application also provides a display device comprising the above-described light emitting device. The display device provided in the present embodiment may be any product having display function, such as a notebook computer display screen, an outdoor large screen, a television, a digital camera, a mobile phone, a tablet computer, or the like. Therein, the light-emitting diode can be used as an indicator of the display device, and can also be used as a backlight of the display device. By setting the protruding structure on the pad of the light-emitting diode, the contact area between the pad and the solder is increased, and the bonding stability of the light-emitting diode and the substrate is improved. At the same time, the projection on the pad on the light-emitting diode is more conducive to heat dissipation, extending the life of the light-emitting diodes. The backlight of the display device requires a plurality of light emitting diodes. Thus reducing the manufacturing cost of a single light emitting diode can reduce the overall manufacturing cost of the display device.

The light-emitting device and the display device provided by the present application provide a protruding structure on the pad of the light-emitting diode, increase the contact area between the pad and the solder, enhance the bonding stability of the light-emitting diode and the substrate, and reduce the manufacturing cost. At the same time, the projection on the pad on the light-emitting diode is more conducive to heat dissipation, extending the life of the light-emitting diodes.

While the embodiments of the present application have been described in connection with the accompanying drawings, those skilled in the art will be able to make various modifications and variations without departing from the spirit and scope of the present application. Such modifications and variations are all within the scope defined by the claims. In the description of the present application, it is to be understood that the azimuth or positional relationship indicated by the terms "up", "down", "inside", "outside", etc. is based on the azimuth or positional relationship shown in the drawings, only for facilitating the description of the present application and simplifying the description, rather than indicating or implying that the device or element is intended to have a particular orientation, is constructed and operated in a particular orientation and is therefore not to be construed as limiting the present application. The phrase "comprising" does not exclude the presence of elements or steps not listed in the claims. The wording 'a' or 'an' preceding the element does not exclude the presence of a plurality of such elements. The mere fact that certain measures are recited in mutually different dependent claims does not indicate that the combination of these measures can not be used for advantage. Any reference signs in the claims should not be construed as limiting the scope.

The invention claimed is:

1. A light emitting device comprising: a light emitting diode and a substrate;
    wherein the substrate comprises a groove, the light emitting diode is in the groove,
    wherein the light emitting device further comprises a bonding substance between the light emitting diode and the substrate, the bonding substances fills a space between the light emitting diode and the substrate and fixes the light emitting diode in the groove,
    wherein the light emitting diode comprises a positive electrode pad and a negative electrode pad, each of the positive electrode pad and the negative electrode pad comprises a plurality of protrusions, the plurality of protrusions are embedded in the bonding substance,
    wherein the positive electrode pad and the negative electrode pad are fixed to the substrate through the bonding substance,
    wherein the positive electrode pad and the negative electrode pad are only located on two side surfaces of the light emitting diode and in direct contact with the light emitting diode, and the two side surfaces of the light emitting diode are opposite to each other and perpendicular to a bottom surface of the light emitting diode,
    wherein an area of the positive electrode pad is smaller than that of the negative electrode pad.

2. A light emitting device according to claim 1, wherein the protrusions have a cross-section of rectangular, triangular, or wavy shape.

3. A light emitting device according to claim 1, wherein the bonding substance is solder.

4. A light emitting device according to claim 1, wherein each of the protrusions extends in a direction perpendicular to the plane at which the positive electrode pad and the negative electrode pad are located.

5. A light emitting device according to claim 1, wherein the protrusions are formed on the surface of the positive electrode pad and the negative electrode pad using die casting, 3D printing, wiredrawing or spraying.

6. A light emitting device according to claim 1, wherein the light emitting diode and the substrate coated with the bonding substance are fixedly connected by means of thermal baking after aligning.

7. A display device comprising the light emitting device according to claim 1.

* * * * *